(12) United States Patent
Fernando

(10) Patent No.: US 10,066,808 B2
(45) Date of Patent: Sep. 4, 2018

(54) OPTICAL SYSTEM FOR LUMINARIES AND LED LIGHTING

(71) Applicant: Ruiz de Apodaca Cardeñosa Fernando, Logroño (ES)

(72) Inventor: Ruiz de Apodaca Cardeñosa Fernando, Logroño (ES)

( * ) Notice: Subject to any disclaimer, the term of this patent is extended or adjusted under 35 U.S.C. 154(b) by 0 days.

(21) Appl. No.: 15/330,418

(22) PCT Filed: Feb. 25, 2015

(86) PCT No.: PCT/ES2015/070134
§ 371 (c)(1),
(2) Date: Sep. 20, 2016

(87) PCT Pub. No.: WO2015/162319
PCT Pub. Date: Oct. 29, 2015

(65) Prior Publication Data
US 2017/0045198 A1  Feb. 16, 2017

(30) Foreign Application Priority Data

Apr. 22, 2014  (ES) .................................. 201430592

(51) Int. Cl.
| | |
|---|---|
| *F21V 17/10* | (2006.01) |
| *F21V 29/77* | (2015.01) |
| *F21V 3/04* | (2018.01) |
| *F21V 5/04* | (2006.01) |
| *F21V 9/00* | (2018.01) |

(Continued)

(52) U.S. Cl.
CPC ............... *F21V 5/04* (2013.01); *F21V 3/061* (2018.02); *F21V 9/00* (2013.01); *F21V 17/101* (2013.01); *F21V 29/77* (2015.01); *H01L 33/52* (2013.01); *F21Y 2115/10* (2016.08)

(58) Field of Classification Search
CPC . F21V 5/04; F21V 5/048; F21V 29/77; F21V 29/777; F21V 3/0418; F21V 17/10; F21V 17/101; F21V 17/102; F21V 31/005
See application file for complete search history.

(56) References Cited

U.S. PATENT DOCUMENTS 5,993,029 A  * 11/1999 Chambers ................. F21V 3/00
362/363
6,203,173 B1 *  3/2001 Duff ........................ F21V 5/048
362/267

(Continued)

*Primary Examiner* — Alexander Garlen

(57) ABSTRACT

The invention relates to an optical system for single-chip or multi-chip LED lamps and luminaires, with heat sink and trim body, consisting of a glass lens which has various geometric shapes having a perimeter rim on the circular base thereof and a rubber seal of matching size via which the lens is inserted, optionally including a self-adhesive translucent polymer vinyl filter on the base of the lens, a trim having a special design in the shape of a top hat and a partially or completely translucent planar glass panel attached under the flange of said trim. The structure of the lens enables the perfect coupling thereof by fitting between the heat sink and the trim body, and can be used for manufacturing novel LED luminaires and modules, or for adapting existing LED luminaires and modules on the market, achieving, through the geometry of the lens, the filter and the planar glass panel, improved efficiency and light quality that is adequate for each specific use.

6 Claims, 17 Drawing Sheets

Figure 3:
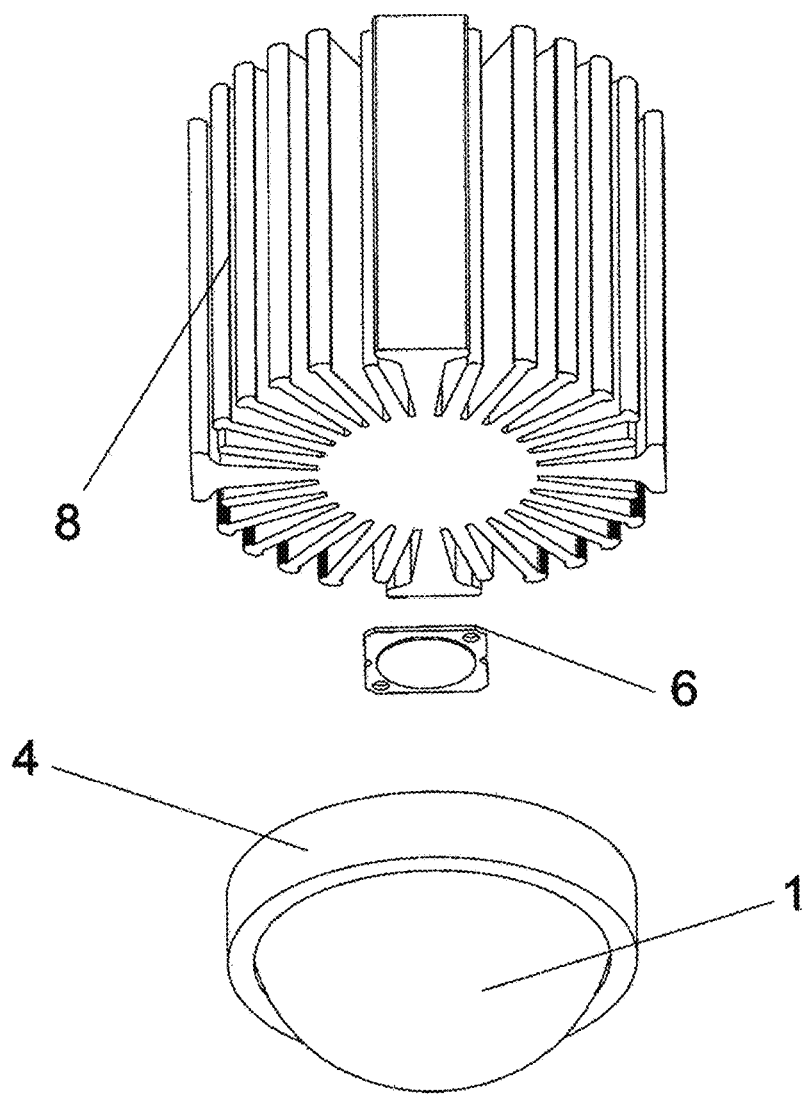

(51) Int. Cl.
 *F21V 3/06* (2018.01)
 *H01L 33/52* (2010.01)
 *F21Y 115/10* (2016.01)

(56) References Cited

U.S. PATENT DOCUMENTS

| | | | |
|---|---|---|---|
| 6,435,691 B1 * | 8/2002 | Macey | F21S 8/024 362/101 |
| 7,004,600 B2 * | 2/2006 | Echterling | F21L 4/005 362/187 |
| 9,651,224 B1 * | 5/2017 | Burgess | F21V 17/16 |
| 2010/0002450 A1 * | 1/2010 | Pachler | H01L 33/58 362/311.02 |
| 2010/0309660 A1 * | 12/2010 | Lim | F21S 48/328 362/231 |
| 2011/0188244 A1 * | 8/2011 | Hong | F21V 5/00 362/235 |
| 2013/0027917 A1 * | 1/2013 | Luo | F21V 25/12 362/157 |
| 2014/0211474 A1 * | 7/2014 | Juan | F21V 15/01 362/267 |
| 2015/0369456 A1 * | 12/2015 | Creusen | F21V 17/002 362/257 |

* cited by examiner

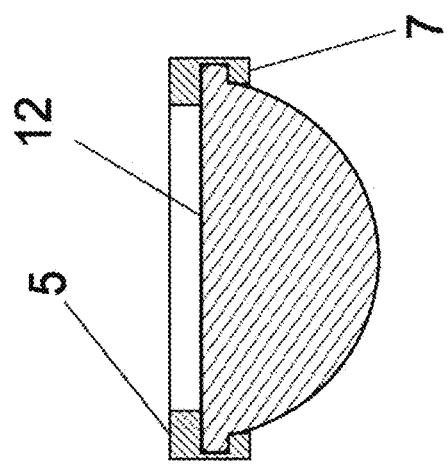
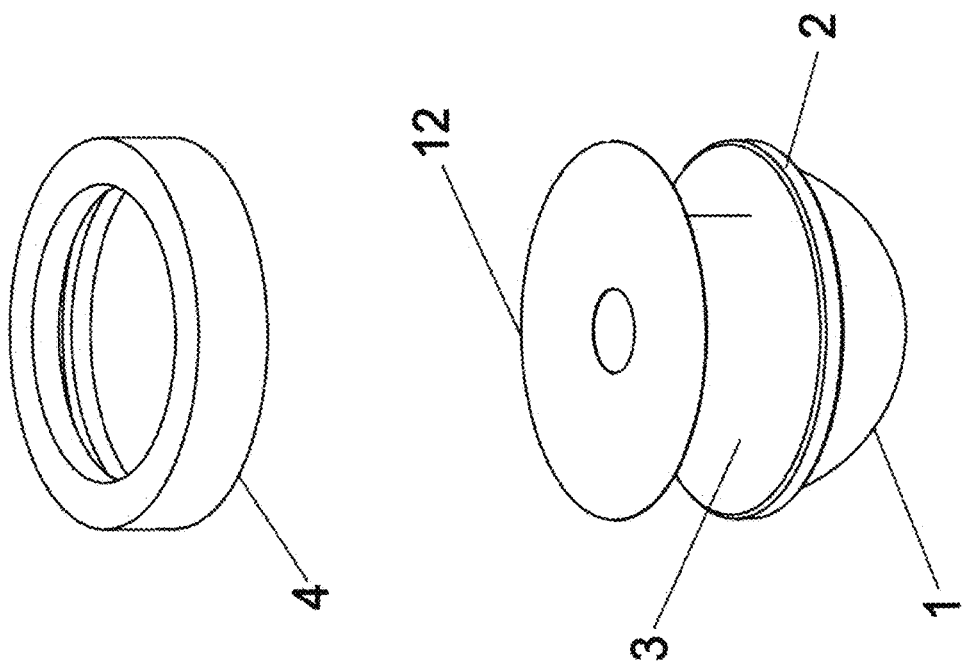

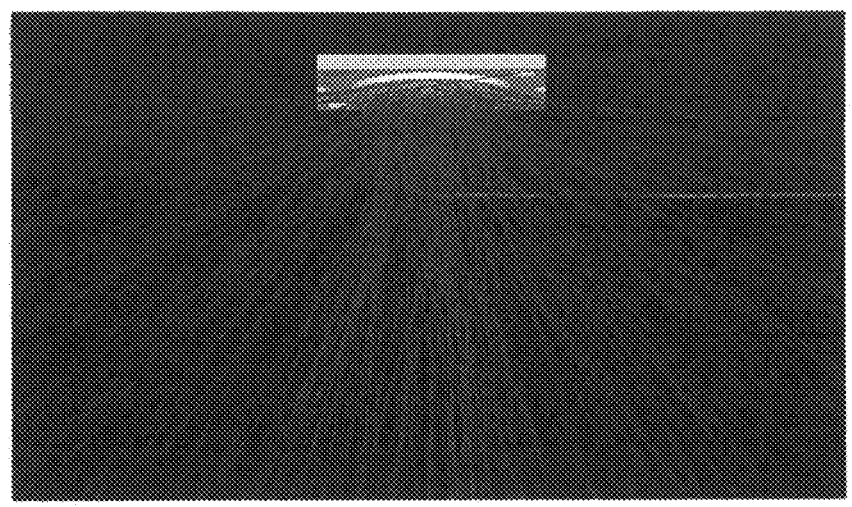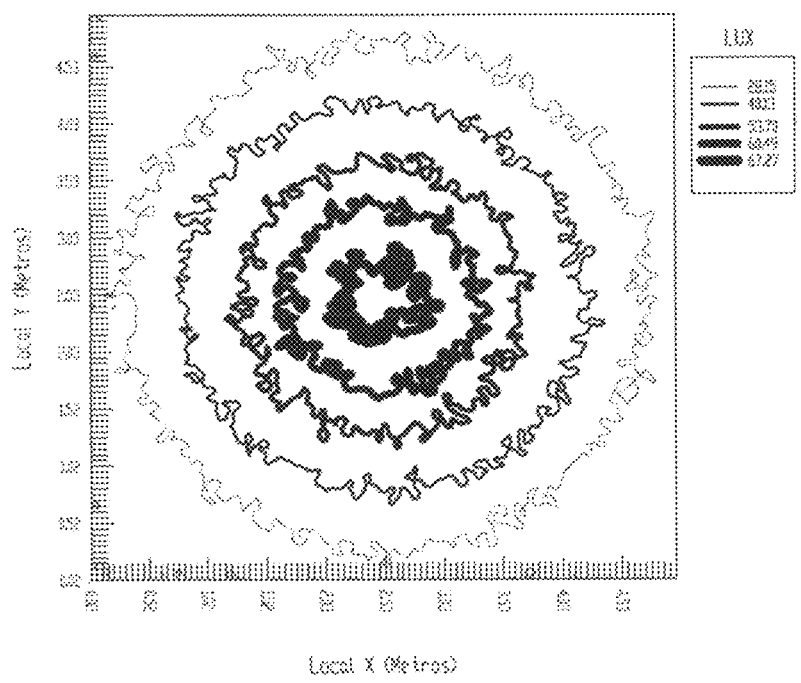
Fig. 10

OPTICAL SYSTEM FOR LUMINARIES AND LED LIGHTING

The present invention relates to an optical system for luminaires and LED lamps, mainly consist of a glass lens with perimeter rim on the circular base, which may have various geometric shapes, such as symmetrical plano-convex lenses, or asymmetrical lenses, a rubber seal of matching size via which the lens is inserted, which enables the perfect coupling thereof by fitting between the heat sink and the trim body of the most widely used in commercial, roads and industries LED modules, getting through the effect of the geometry of lens, a considerable increase of the luminous efficiency of and an adapted photometry for the particular application.

The system can incorporate additional elements, such a self-adhesive disk filter on the base of lens to eliminate the effect of chromatic aberration, and a trim body which enables setting below a completely or partial translucent flat glass to improve the diffusion of light for different areas.

This new optics system for LED lighting can be applied in manufacturing or adaptation of the most common luminaires such as downlight LED, LED lighting surface, industrial LED modules, for street lighting or any type of lighting used in the market.

It is a single system of manufacturing that improve or simplifies manufacture of the different types of existing standard luminaires.

TECHNICAL FIELD

The technical field of the invention is to provide devices or light systems consist on LED lighting technology for lenses and optical components used in luminaires and LED lamps.

STATE OF THE ART

Nowadays, there are a wide range of LED and lamps luminaires of different characteristics that are grouped depending on their intended use. It may be used for residential lighting, commercial or industrial sector, which usually use specific devices and lighting systems.

Most manufacturers use plastic optical designs for the manufacture of multichip, for COB LEDs or encapsulated LEDs. The plastic materials lenses made of polystyrene low cost or high quality materials such as optical grade polycarbonate or acrylic, which enhances the transmission of light through the optical, influence the efficiency of the LED light, limiting the light output focusing and shaping the emitted light. However, light photometry usually obtained with these lenses is not comparable with glass lenses, particularly the borosilicate low cost lenses with a transmission rate of the light higher to 90%, but this does not resolve completely the lighting needs of spaces and uses for which lighting LED devices are installed.

Therefore, some manufacturers have started using glass lenses for lighting designs, but these lenses do not have means for coupling to different existing lighting devices.

Overall, there are no lenses and optical designs for LEDs that will enable their integration or adaptation to the most common available luminaires, formed by a single-chip or a multichip semiconductor assembled on a base of COB LED type, or encapsulated LED with the heat sink and the trim body incorporated, usually built around it.

The utility model ES1074792-U, of 2011, shows an example of a LED lamp design, "LED lighting Focus" characterized by a structure that adjusts and fixes the light diffusing lens to the heat sink, using a clip ring system or a washer clip that allows to change and replace easily the LED lamp, but this adjustment of the lens is designed for this particular type of focus, LED lamp, offering an easy assembly, rather than an optics for different types of lamps and luminaires.

The technical problem then arises of having an optical component that can be applied to different types of luminaires and LED lamps already existing in the industry, providing an adequate photometry to the specific intended use, meeting the needs of each lighting project in the commercial or industrial sector.

At this point, this problem is solved with the optical system for LEDs claimed in this invention, based on the use of glass lenses and a special rubber seal where the lens is inserted, which allows a perfect coupling by deep drawing process between the heat sink and the trim body and whose different photometric effects produced by these lenses on the light source can be conveniently adjusted using a filter adhesive to the base of the lens used to eliminate the effect of chromatic aberration, and a partially or completely transparent glass, incorporated into the trim body designed for this purpose to spread the light in the environment, that will be described in further detail below.

SUMMARY OF THE INVENTION

The optical system for luminaires and LED lamps mainly consists of two component elements: a glass lens that has a higher transmittance than plastic, and does not suffer any degradation with time, a perimeter rim on the circular base, and a special rubber seal similar to the base of the lens size, a vertical external side and internal slot for insertion of the lens, which forms on its inner side an upper lip with a suitable size to achieve a separation specified between the semiconductor and lens, and a lower lip sized to collect the flange holding, leaving the rubber gasket retained by embedded pressure below the sink and inside the crown of the trim body.

Note that the rubber seal has been specially designed to achieve that pressure is exerted to the heatsink by drawing on the housing trim, so it is fixed and held on over different kinds of trims bodies used in the manufacture of the existing luminaires, such as, downlight, surface lighting, street lighting, industrial bells, etc., and supporting a specified separation depending on the type of lens between the LED and lens to ensure the maximum efficiency of the optical system.

The optical glass lens provides that the light beam emitted by the LED lamp unidirectionally, to expand and to spread it in a variable angle with different axes depending on the geometry of the lens, which is an angle between 50° and 110° with plano-convex lenses.

The system provides the possibility of using lenses of different vitreous materials preferably borosilicate glass and different geometries to project the light with the corresponding photometries, which are embedded or adapted into the trim body identically.

Thus, the lens may be smooth, corrugated or with a hollow as a cap of various symmetrical or asymmetrical shapes on the flat side, while on the other side of the lens, the curved surface, it can also present different symmetrical or asymmetrical geometries. In any case, it is important to stress that the lens shows in every types the same circular or elliptical edge.

There is an option provided by the system, in order to eliminate the effect of chromatic aberration produced by the lens of glass, consisting in applying on the surface of the lens, self-adhesive translucent polymer vinyl filter, that it is inserted at the edge with the perimeter rim of the lens in the perimeter rim of the rubber seal.

This filter might or might not be used, depending on what is intended to be lighted. This is the case, for example, the filter is not very useful in the industrial sector due of the height in which the luminaires are usually installed, and in addition, the chromatic effect produced by glass lenses is not very importance in these types of facilities.

However, the filter is useful for lighting commercial premises (FIGS. 11 and 12), because it is important to eliminate the chromatic aberration effect and produce uniform illumination.

Although the basic optical system of glass lens with the rubber sealing clamping, with or without filter, can be adapted to any type of trim design, exerting pressure toward the heat sink, the system provides the possibility to add specific trim design, to create LED modules, and especially, in order to complement the optic with a translucent and/or transparent flat glass to improve the lamps photometry, offering as final result the possibility of produce direct light transmission and/or diffuse and selective LED luminaires through the lower flat glass.

This specific trim design for a particular system implementation consists of a flat ring with a perpendicular fin, although the lateral side may also show curved according to the final aesthetic effect of the for the lamps, but in any case it will be showed with a double folded squarely inwardly by the top edge to form an inverted "U" shape fold.

This U-shaped folded has the dual purpose of enabling its attachment to the end of the heat sink and the double folding by screws or other mechanical means, clinching, or press joining the rubber seal and the lens by folded inner side, where the lens is embedded, whereas the flat wing enables fixing the bottom, also by mechanical means, of the special flat glass that modifies the system photometry.

This flat glass is an additional element of the system, so that is fixed below the lower circular wing of the trim body. It is a glass with a transparent part, to provide a direct light and a partly translucent light, to provide diffused light simultaneously, or can be, a flat translucent glass to provide diffused light only.

Use totally or partially translucent glass plans to create, by the effect of light transmission, diffuse and direct light simultaneously, is a very good solution for LED lighting projects in commercial buildings, since it is possible to easily adjust the direct and diffuse light to be determined for a LED lighting design, changing only the flat glass.

This new LED optical system provides customized solutions adapted to light intensity and photometry for any lighting project in commercial, industrial or urban buildings, only changing the optics of the luminaire and the trim heat sink. Note that these glass lenses can reach up 270% more light with the same LED power as shown by the results of tests conducted.

DESCRIPTION OF DESIGNS

For a better understanding of this specification, the figures that describe the object of the invention of the optic system parts are attached including the filter disk.

FIG. 1: exploded view of essential elements of the system: the glass lens with perimeter rim and the special rubber seal including the filter disk.

FIG. 2: Cross section view of the essential elements in FIG. 1 coupled, with integrated filter.

FIG. 3: The lens assembly with rubber seal over the heat sink around the internal LED.

Figure 4:
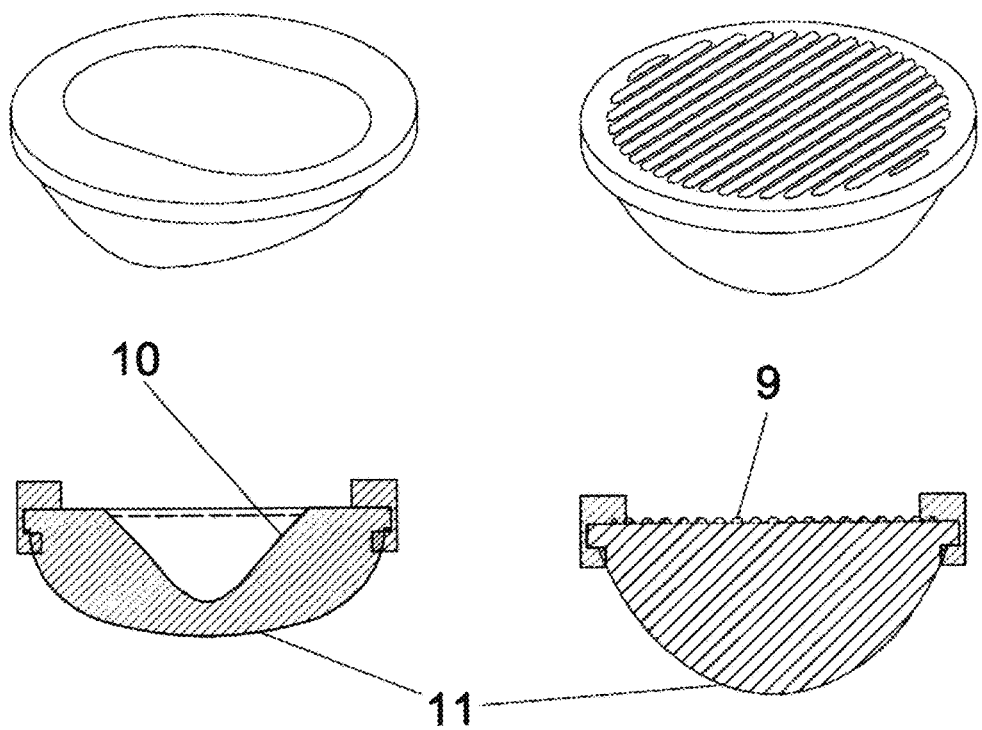

FIG. 4: Two types of borosilicate glass lenses; the lens on the left is asymmetric with an internal hollow, and lens on the right shows one side with a corrugated base and a convex surface y the other surface.

Figure 5:
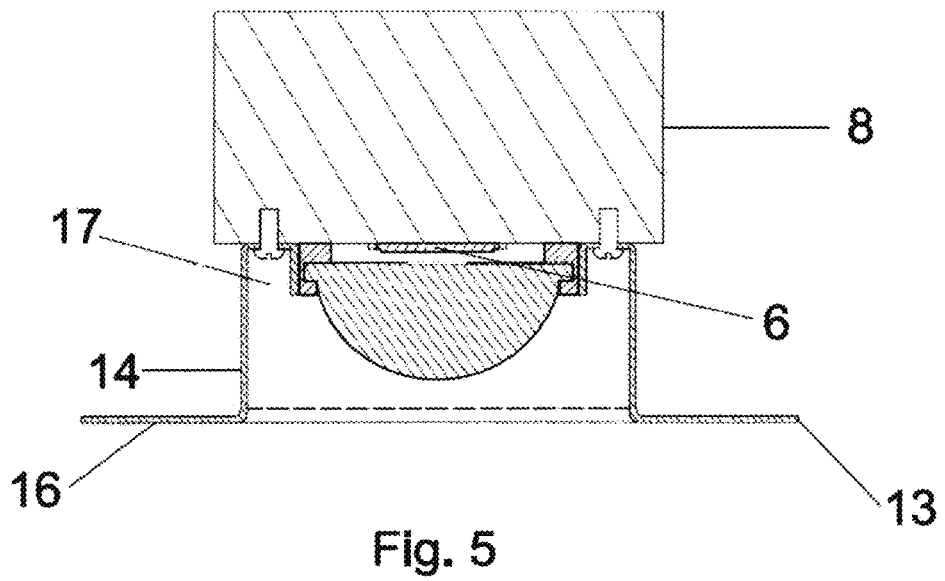

FIG. 5: A section of the assembly where the trim is shown on a LED with the heatsink.

Figure 6:
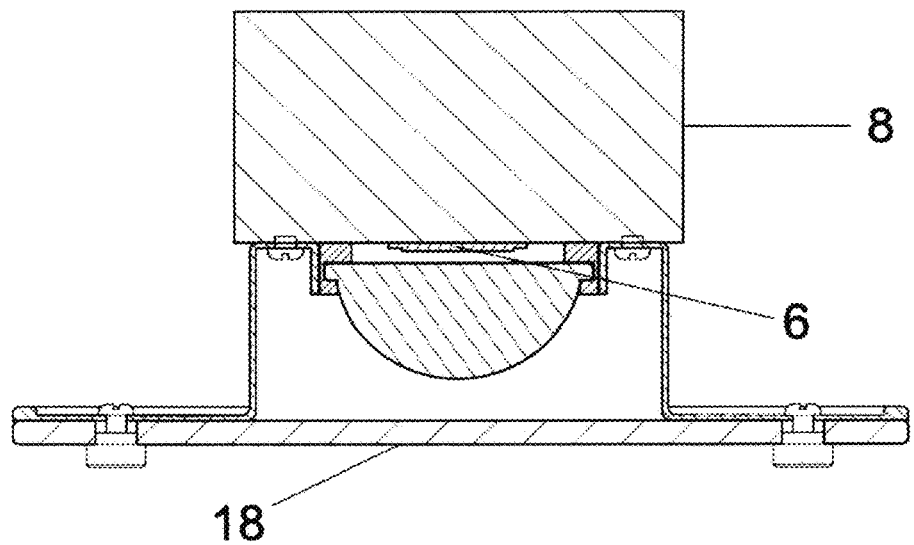

FIG. 6: Figure of the assembly wherein the trim body and a flat glass on a LED sink shown.

Figure 7:
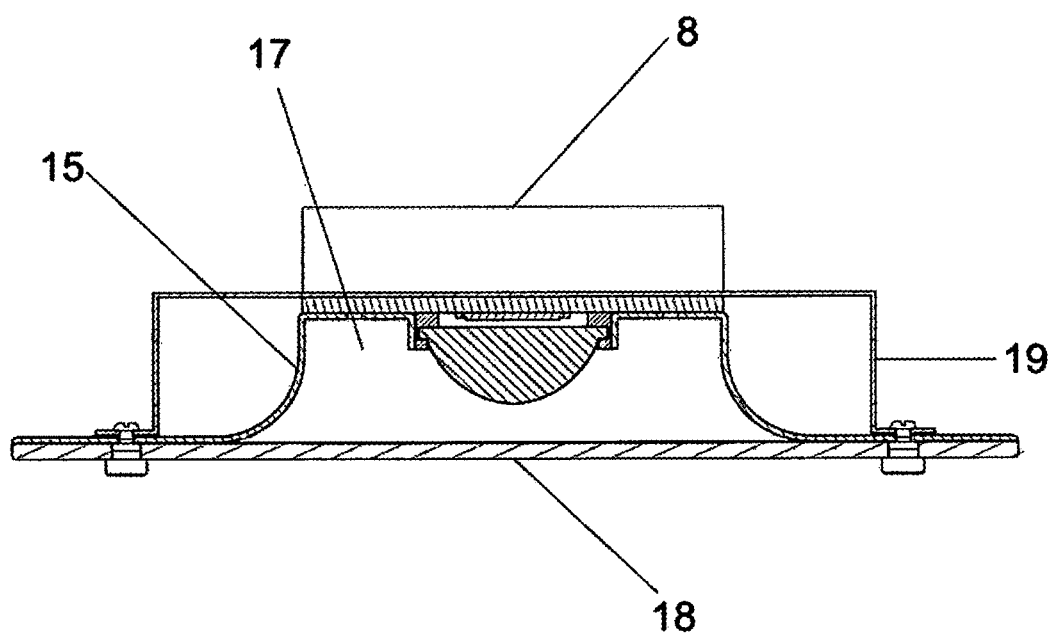

FIG. 7: the assembly wherein the curved trim body and a flat glass on a LED sink shown of a "downlight" or recessed ceiling design providing a connecting structure to the ceiling with springs.

Figure 8:
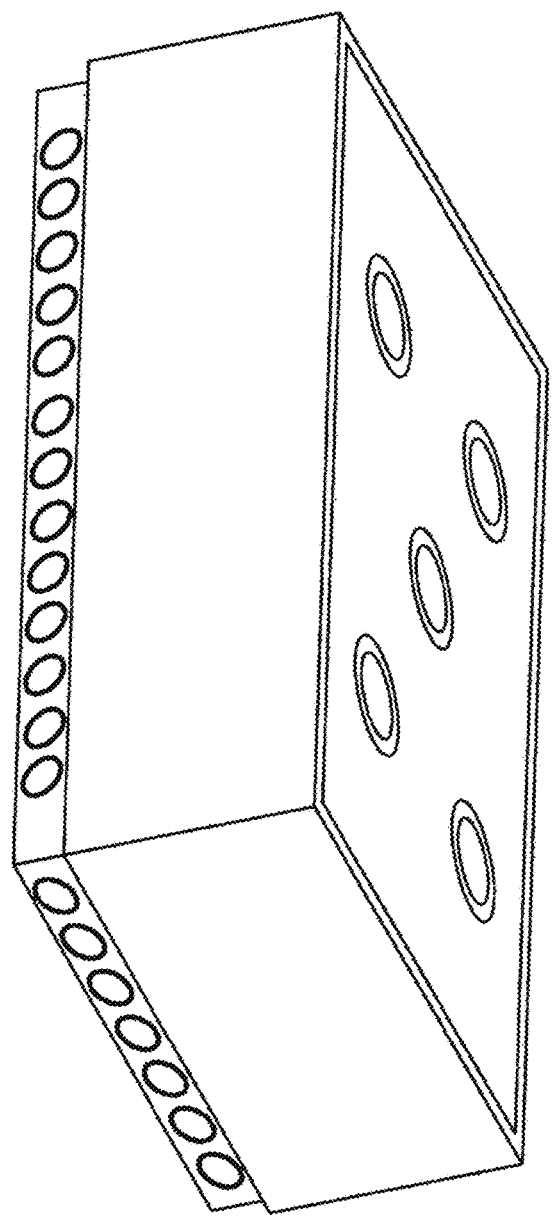

FIG. 8: A lighting structure grouping LED modules with a built-in optical system.

Figure 9:
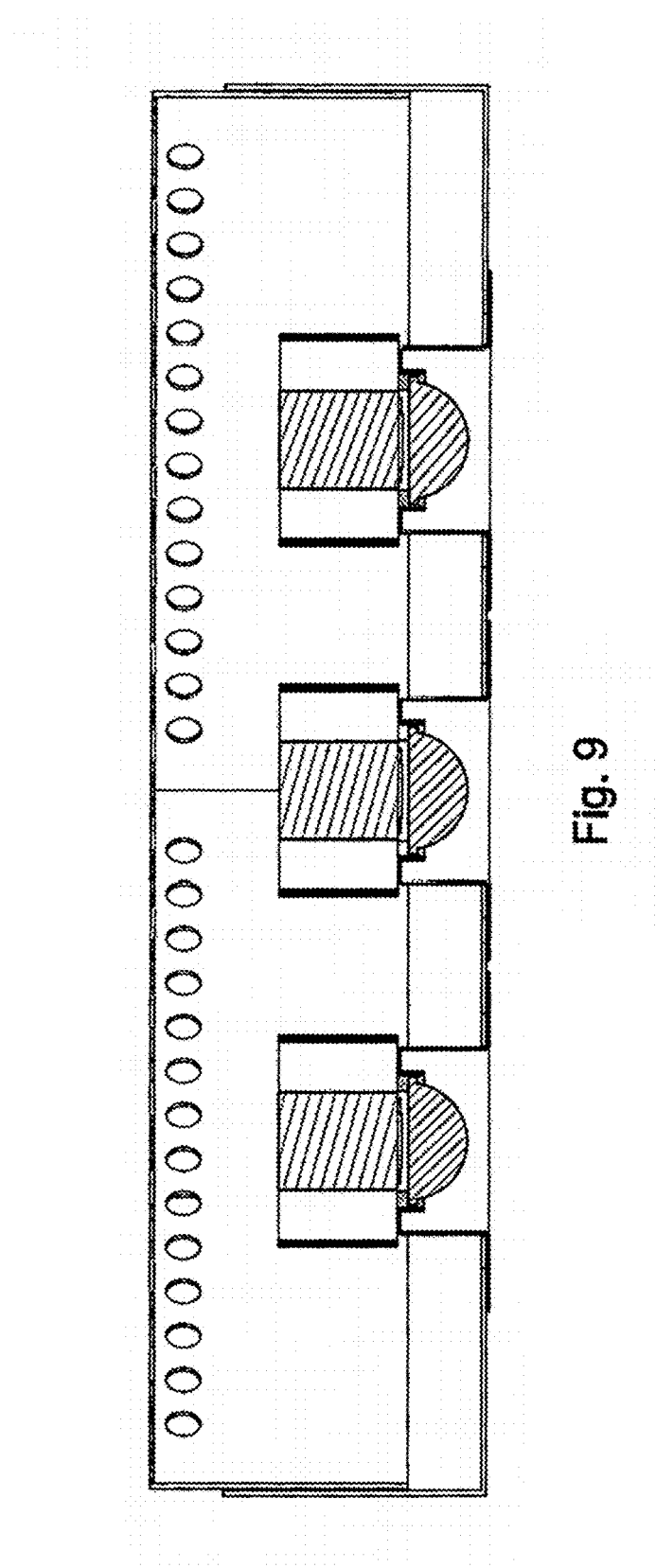

FIG. 9: View of the luminaire's structure in FIG. 8 in cross section.

FIG. 10: Figure showing a distribution of rays of a COB LED type or an encapsulated LED, and a map of isolines associated with a height of 3 m on a flat of 5×5 m.

Figure 11:
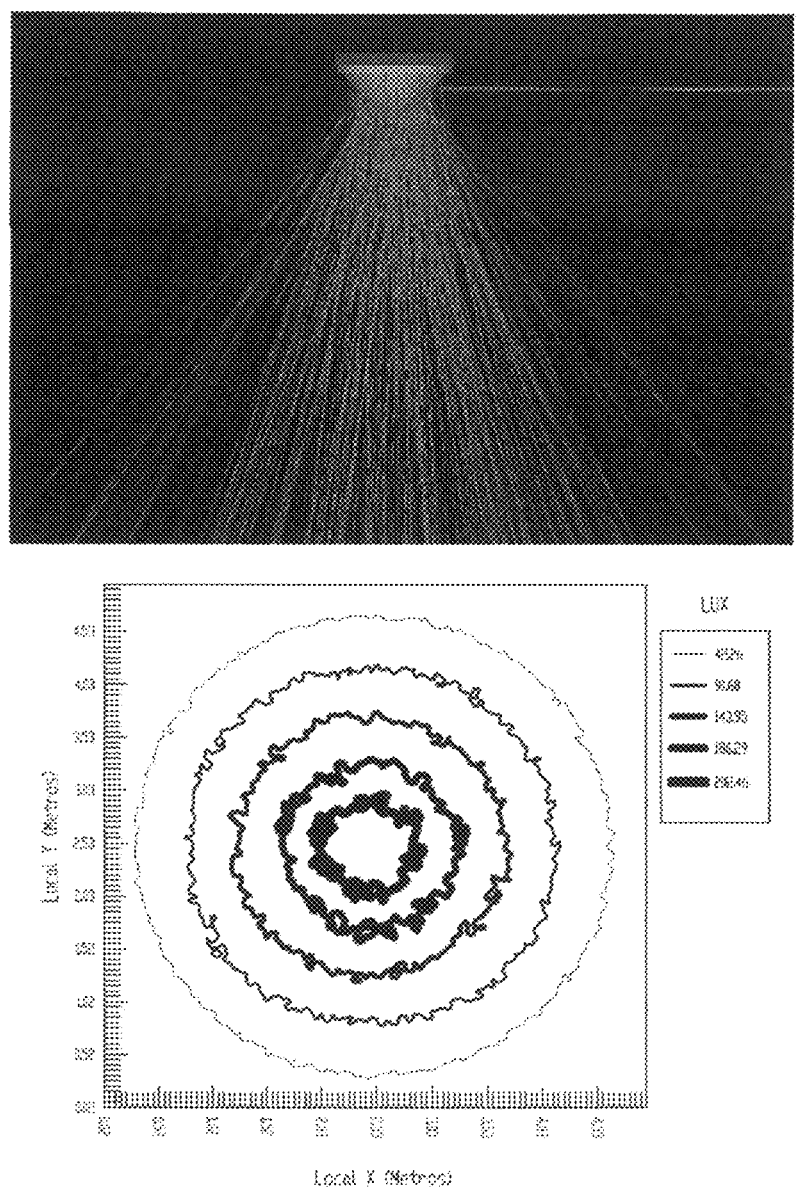

FIG. 11: Figure showing a distribution of rays of a COB LED type or an encapsulated LED, and a map of isolines associated with a height of 3 m on a flat of 5×5 m, identical to the previous figure, but with an integrated optical system.

Figure 12:
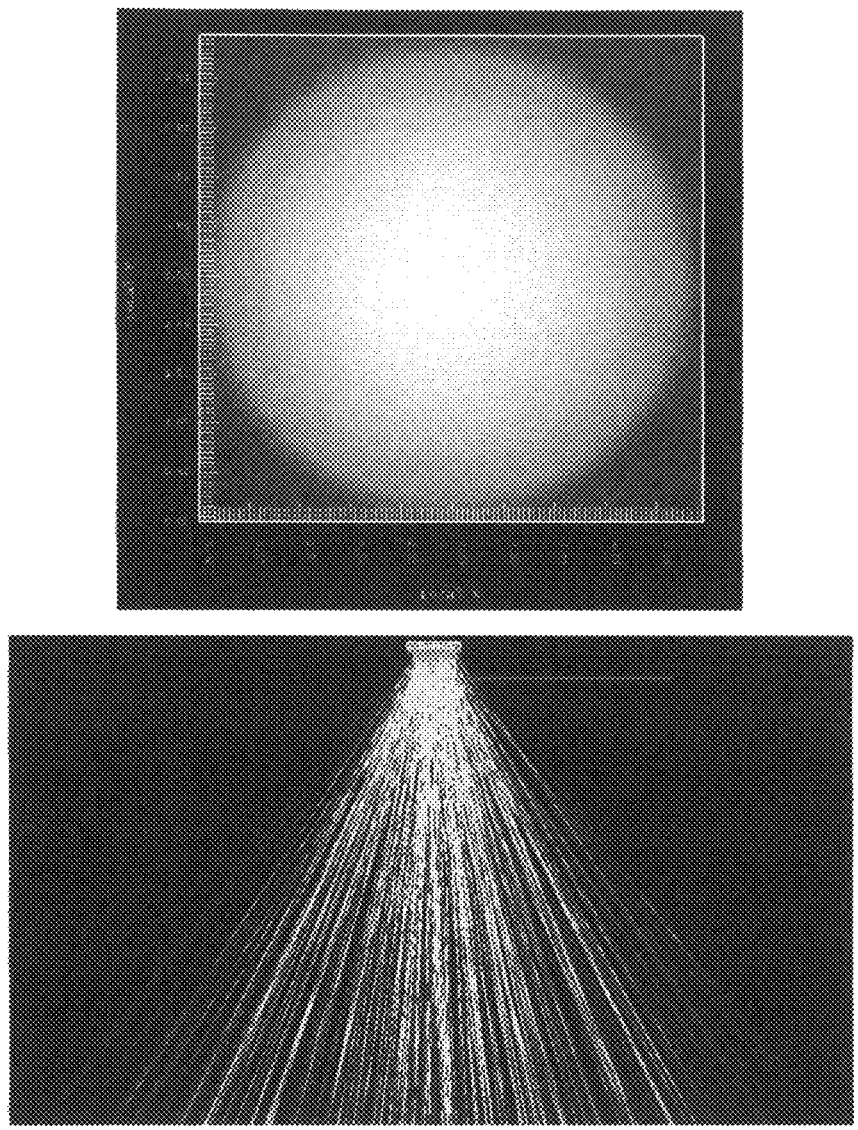

FIG. 12: A distribution of LED rays similar than FIG. 11, with an optical system, and a plane associated illuminance.

Figure 13:
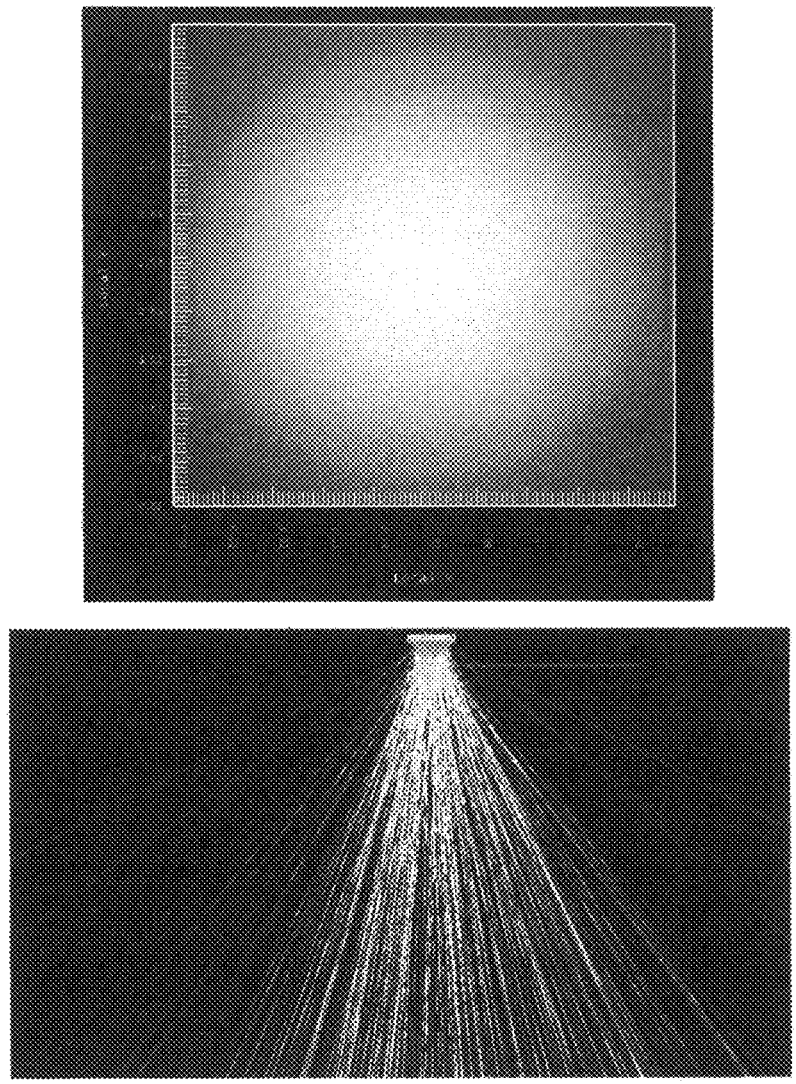

FIG. 13: A distribution of LED rays similar than FIG. 11, with an optical system with filter, and a plane associated illuminance.

Figure 14:
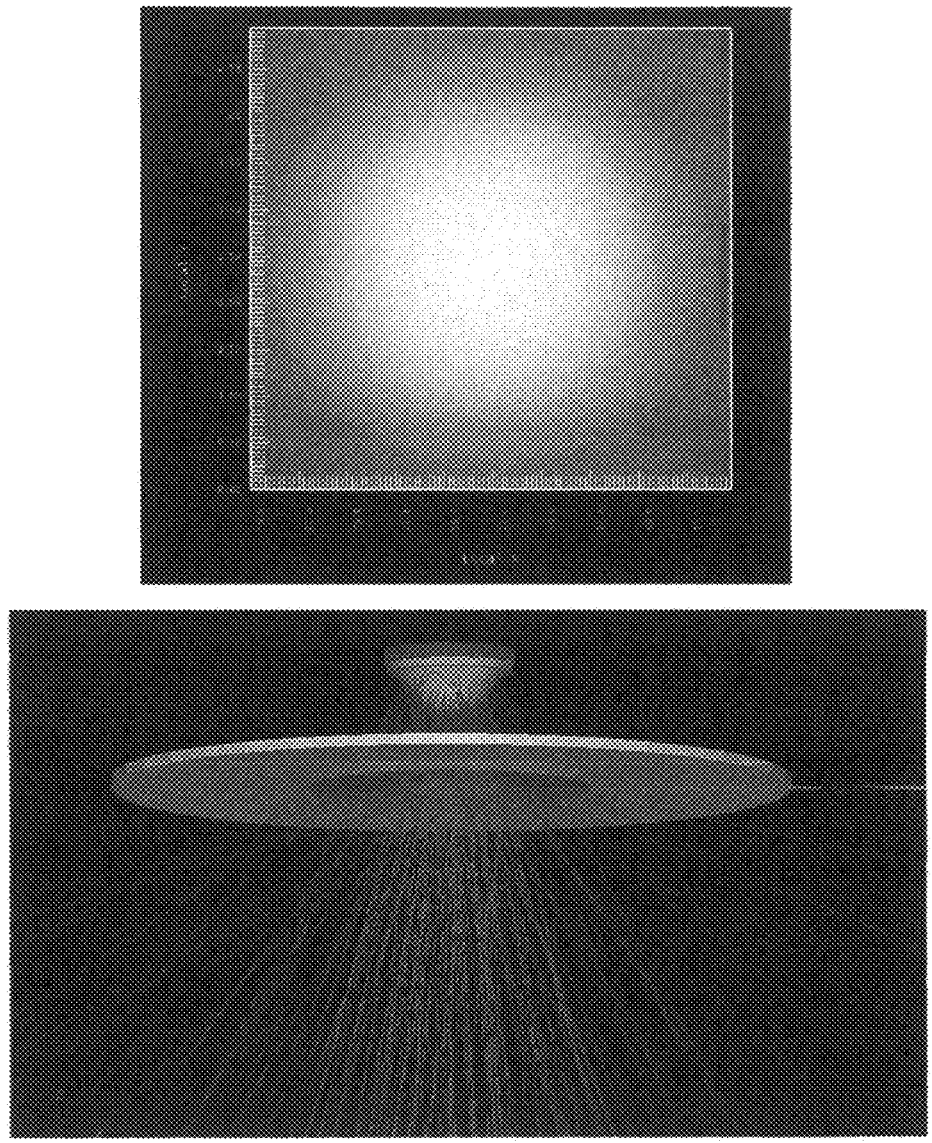

FIG. 14: A distribution of LED rays, with an optical system with filter and a partially translucent flat glass and an associated illuminance plane.

Figure 15:
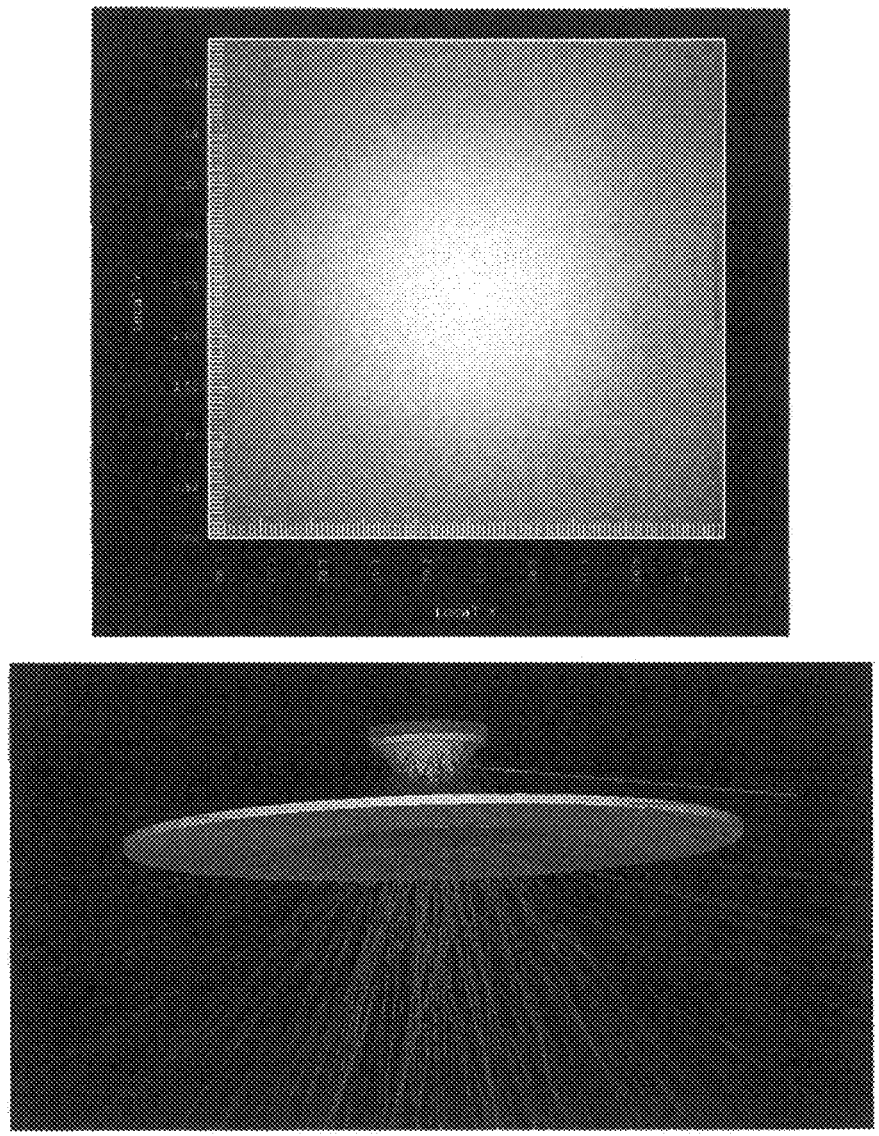

FIG. 15: A distribution of LED rays, with an optical system with filter and a translucent flat glass and an associated illuminance plane.

Figure 16:
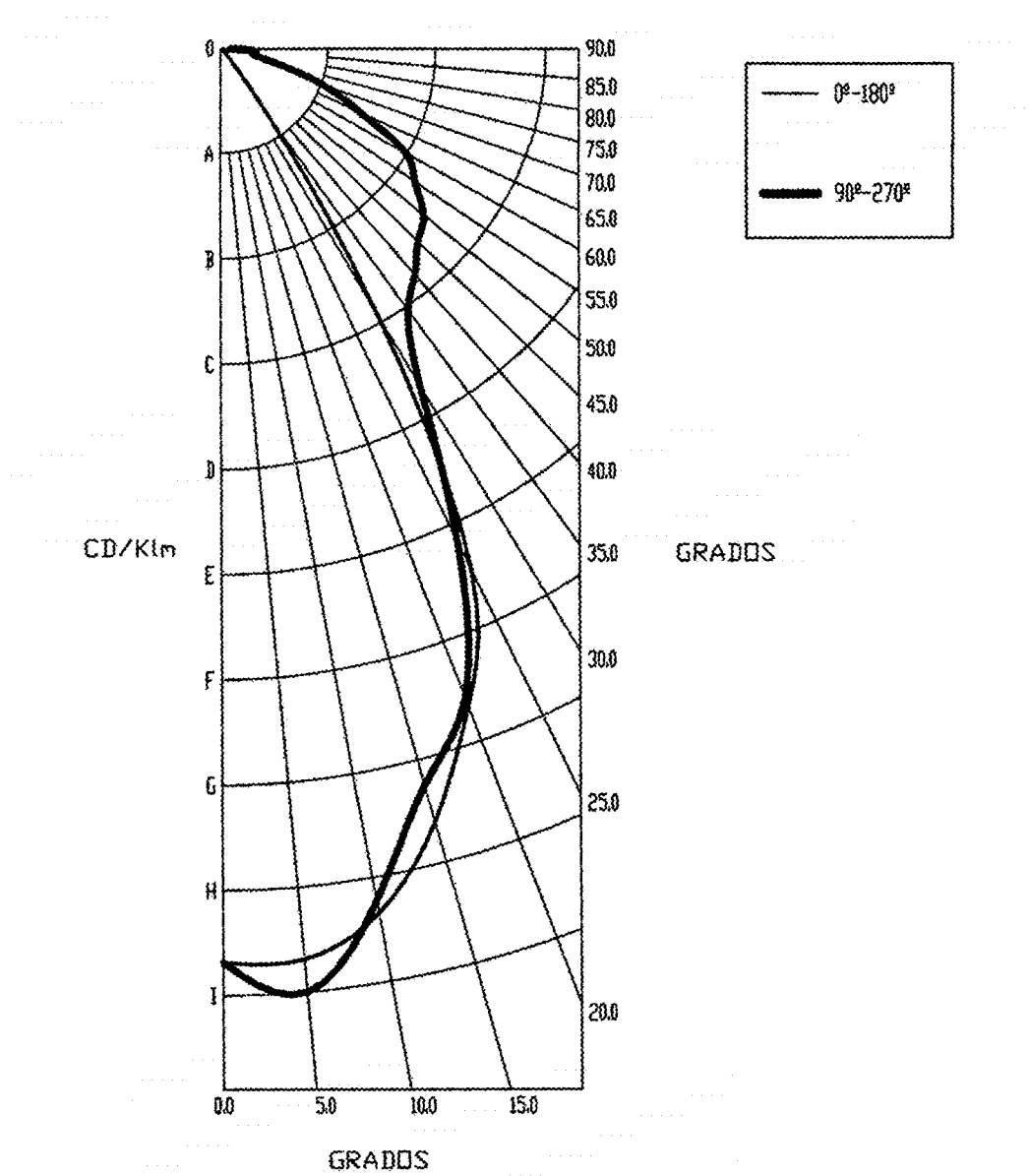

FIG. 16: A photometric graph of the optical system with asymmetrical lens.

Figure 17:
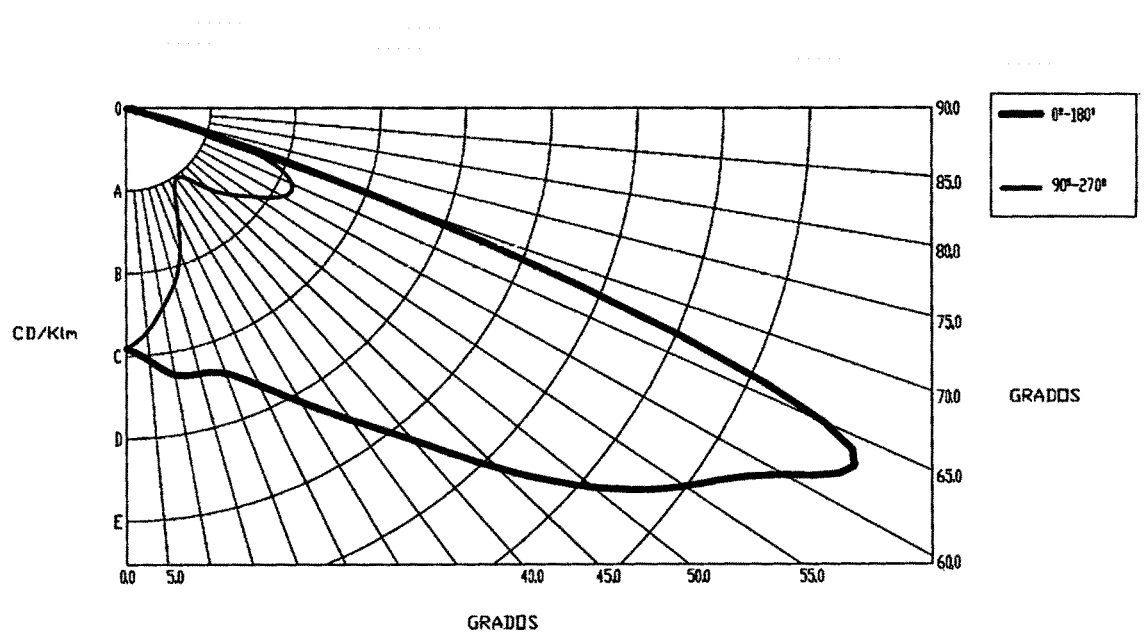

FIG. 17: A photometric graph of the optical system with a corrugated flat convex lens.

Figure 18:
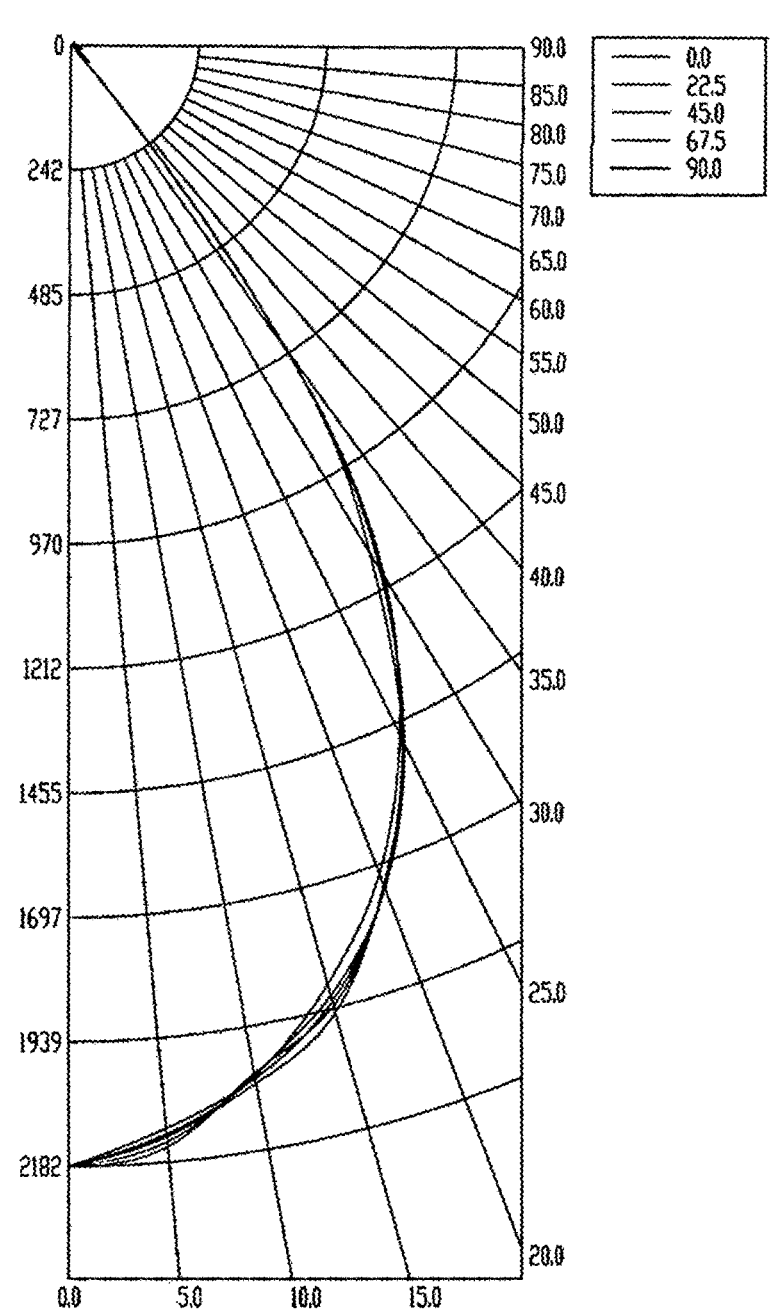

FIG. 18: A photometric graph of an independent LED module with an optical system.

Figure 19:
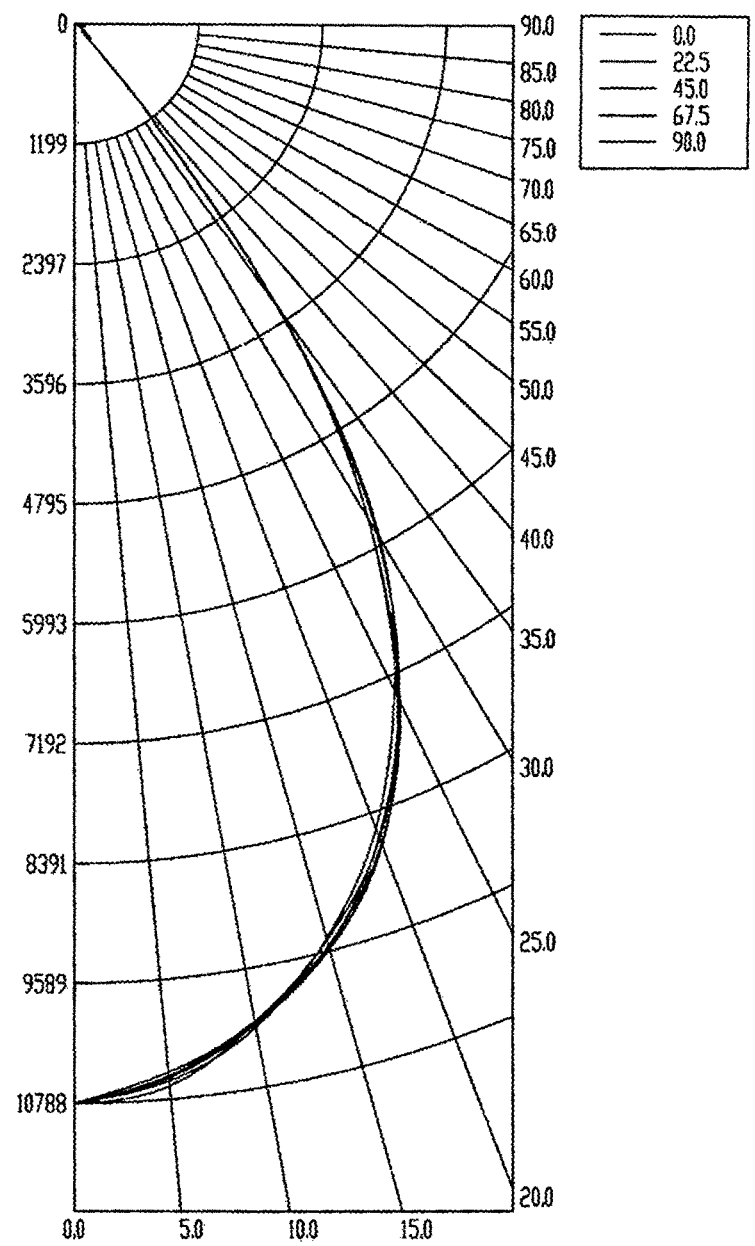

FIG. 19: A photometric graph of 5 LED modules an optical system.

DESCRIPTION OF THE INVENTION

The essential components of the LED optical of the invention are shown in FIG. 1, which includes a glass plano-convex type lens (1), with perimeter rim (2) on its circular base (3) a rubber seal (4) of matching size via which the lens is inserted.

Internal projections of the rubber seal formed by the circumferential groove are shown in the FIG. 2, both the upper protrusion (5) with an exact height required to achieve separation between the semiconductor LED and lens, as the lower protrusion (7), whose size is the same as the rim of the lens for perfect insertion.

Both figures also show the position of the adhesive disc-shaped filter (12), whose optional use eliminates the effect of chromatic aberration, stuck on the base of the lens, being inserted into the groove of the rubber gasket.

The glass lens can have different geometries, on which the luminaire photometry depends. The only thing that does not change in the lens design is the circular outline of its base and the perimeter rim insertion into the coupling joint, but both the shape of the base, as the shape and degree of curvature of the curved surface can change.

Two other specific lens designs are shown in FIG. 4, a corrugated base lens, and a perforated elliptical shaped inverted cone base.

The basic optical device created of glass lens with suitable geometry, with a rubber seal, with or without filter; it is integrated into the different types of luminaires and LED lamps, from industrial luminaires to "downlight" small LED, inserting the optics on the LED heat sink, by inside the trim crown body, since the pressure exerted on the inner side of the crown makes the device is perfectly retained. This allows it to be incorporated into luminaires installed in buildings, just removing the existing lens.

The position in which the optical is connected on the sink (8), around the LED semiconductor (6) is shown in FIG. 3. The trim body retaining element, which is fixed to the heatsink by holes provided in the base, is not shown in this figure, but the holes are shown.

It is necessary to focus on the preference implementation of the optical system with integrated trim body, according to the FIGS. 5, 6 and 7, where it is perfectly appreciated how the rubber seal and the lens inside the crown of the trim body (13) is placed; the trim body described above with a flat wing (16) and a straight (14) or curved side (15), folding in an inverted U shape (17) by the upper circumference edge, being inside where it is embedded and retained by pressure the rubber seal with the lens.

The joining of the trim body and the heat sink through screws in the threaded holes of the heat sink base is also shown in the FIGS. 5, 6 and 7.

The partially or completely translucent flat glass (18) supplementing the optical system in order to obtain an adequate light diffusion, of light is required for installation of indicated specific design of trim body, because the glass is mechanically fixed by screws or rivets, below the lower wing (16) of the cup-shaped crown.

The special design of the trim body made for the optics of the invention offers the possibility of manufacturing LED modules incorporating this optical advantageous.

A LED lamp or module like this will be constituted by a LED semiconductor with common heat sink, where the trim body is fixed, and the glass lens is fitted, with or without filter, through the rubber seal, optionally supplemented by special flat glass set under the wing of the trim body.

These LED modules with the described invention optic, may be used as individual points of light, integrated into ceilings and surfaces with appropriate means of installation, such as a clamping bridge (19) of the luminaire "downlight" shown in FIG. 7.

It is possible to set LED higher power luminaires structures, grouping modules, as shown in FIGS. 8 and 9, where a folded structure is grouping several LED modules, which are integrated through punched holes in the base with the same diameter of the trim module crown, which are fixed by the circular outstanding and coplanar wing to the structure.

This grouping modules system or individual lamps is great for manufacturing of industrial lighting modules with LED lighting technology.

Results Photometric Estudies:

The luminous efficiency can be improved compared to a LED luminaire without optics, up to 270% relative to a given working plane, such as a desk, modifying the geometry of the glass lens as the essential element of the optical system developed due the refraction effect of light rays.

Photometric studies conducted by DIALUX software, indicate this improvement. If the isolines plane, of the COB LED type or an encapsulated LED rays without optical shown in FIG. 10, are compared with the isolines plane that uses an optical lens of plano-convex glass symmetrically, shown in FIG. 11, the level of illumination of the second case, expressed in LUX, increases respect the first case.

The simulations with the same lens and a disc filter also show a decrease in luminous efficiency between 3 to 6%, depending on the filter, as a result of the elimination of chromatic aberration. For example, FIG. 12 shows the distribution of rays and the luminance plane associated with a LED with the same optical as above, with a symmetric lens plano-convex without filter, where the effect of chromatic aberration shown with an illumination more concentrated in the center of the lighting circle, compared with FIG. 13, showing a distribution of light and the luminance plane of a LED with the same lens but with the vinyl filter claimed of polished translucent polymeric material, where the chromatic defect has been eliminated and the light distribution is more homogeneous in the whole circle of illumination.

The effect on the diffusion of light produced by the optical system with special built flat glass has also been tested. If a LED luminaire with optics and with the same filter of the above type is added, a flat glass with a translucent side and a other transparent side, as part of the body of the trim, rays distribution of light and the luminance plane shown in the FIG. 14, which shows direct light concentrated at the center of the plane, and diffused light in the environment is generated, and using a translucent plane glass with the same optical, the distribution of the light and luminance plane of FIG. 15 is obtained, which shows only diffuse light.

In order to facilitate understanding of the two figures, the rays that are reflected in the flat glass to the trim body, which subsequently are reflected or transmitted through the plate glass, have been erased.

The different geometries of the lenses used in the invention produce different photometric curves; the light distribution curves, that show the relationship between the light intensity (CD/Klm, where K=1000), with the angle (in degrees) of the expansion of the light. For example, the FIG. 16 graph shows the photometric curve of the optical system with an asymmetric lens with the inner cavity of FIG. 4, and the FIG. 17 graph shows the photometric curve of the optical system with a corrugated base lens and convex surface of the same figure above.

In any case, for the same lens geometry, the photometry curve remains constant regardless of the number of lenses used, such as the LED clusters modules with the same optics in the industrial luminaires manufacture. The FIG. 19 graph shows the photometric curve for a group of five LED modules with optical system, and FIG. 18 shows the same photometric curve for one of these individual modules, confirming the advantages of modules groups to increase the light intensity for the same photometry.

The invention claimed is:

1. An optical system for luminaires and LED lamps including a single-chip or multichip LED placed over a plate or encapsulated with a heat sink, and a crown shaped trim body attached to the heat sink and disposed around the semiconductor, the trim body including a vertically straight inner wall; wherein the optical system comprises: a glass lens having a circular lens base with a perimeter rim protruding outward from the lens base about an outermost circumference of the glass lens; and a rubber circular seal of a complementary size to the lens base, the rubber seal having a vertically straight outer side and an inner side including an internal slot in which the perimeter rim of lens is disposed, the inner side of the rubber seal further comprises an upper lip of suitable size to achieve a specified separation between the LED and the lens, and a lower lip of suitable size to collect the perimeter rim of the lens; the optical system being removably retained within the trim body only by pressure directly between the heat sink and the upper lip and pressure directly between the inner wall of the trim body and the outer side of the rubber seal.

2. The optical system for luminaires and LED lamps, according to claim 1, wherein the base of the glass lens has one of a smooth shape, a corrugated shape, an internal cavity, and different symmetrical or asymmetrical shapes; wherein an angular surface on the opposite side of the lens from the base has similar or different symmetrical or asymmetrical geometries.

3. The optical system for luminaires and LED lamps, according to claim 2, wherein the glass lens is a borosilicate lens having a plano-convex symmetrical geometry.

4. The optical system for luminaires and LED lamps, according to claim 3, wherein the glass lens has a translucent, disc-shaped, frosted polymeric vinyl self-adhesive filter superimposed on its base and including a rim, the filter inserted by its rim along the perimeter rim of the lens within the internal slot of the rubber seal.

5. The optical system for luminaires and LED lamps according to claim 1, wherein the trim body is formed by an external ring which has two geometric shapes as a top hat shape, or a curved shape, and a flat wing, folding in an inverted U shape that allows the connection by screws or other mechanical means of the trim body to d base of the heat sink by an upper circumference edge, the inner wall of the trim body extending vertically from the upper circumferential edge.

6. The optical system for luminaires and LED lamps according to claim 5, further comprising a transparent or translucent plate glass, fixed to the trim body below the lower wing.

* * * * *